US008008611B2

(12) United States Patent
Kim et al.

(10) Patent No.: US 8,008,611 B2

(45) Date of Patent: Aug. 30, 2011

(54) PHOTO SENSOR AND FLAT PANEL DISPLAY USING THE SAME

(75) Inventors: Do-Youb Kim, Suwon-si (KR); Keum-Nam Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 702 days.

(21) Appl. No.: 12/215,417

(22) Filed: Jun. 27, 2008

(65) Prior Publication Data

US 2009/0174731 A1 Jul. 9, 2009

(30) Foreign Application Priority Data

Jan. 9, 2008 (KR) ........................ 10-2008-0002611

(51) Int. Cl.
*H01L 27/00* (2006.01)

(52) U.S. Cl. ................ 250/208.1; 250/214 AL; 348/308

(58) Field of Classification Search ............... 250/208.1, 250/214 AL, 214 R, 214 B, 214 C; 348/294, 348/308; 345/44, 204, 207
See application file for complete search history.

(56) References Cited

U.S. PATENT DOCUMENTS

| | | | | |
|---|---|---|---|---|
| 6,576,882 | B2 | 6/2003 | Muramatsu et al. | |
| 2003/0142047 | A1 | 7/2003 | Inoue et al. | |
| 2004/0196398 | A1 | 10/2004 | Doering | |
| 2005/0121519 | A1 | 6/2005 | Shinohara | |
| 2006/0158542 | A1 | 7/2006 | Mizuno | |
| 2006/0214893 | A1 | 9/2006 | Tseng et al. | |
| 2007/0070056 | A1 | 3/2007 | Sato et al. | |
| 2007/0132869 | A1 | 6/2007 | Genilloud | |
| 2007/0181881 | A1 | 8/2007 | Koh et al. | |
| 2007/0229398 | A1 | 10/2007 | Oh | |
| 2008/0001910 | A1 | 1/2008 | Lim | |
| 2009/0166510 | A1 * | 7/2009 | Park et al. | 250/205 |
| 2011/0043473 | A1 * | 2/2011 | Kozuma | 345/173 |

FOREIGN PATENT DOCUMENTS

| | | | |
|---|---|---|---|
| CN | 1459088 | A | 11/2003 |
| CN | 1940841 | A | 4/2007 |
| CN | 101017843 | A | 8/2007 |
| CN | 101097309 | A | 1/2008 |
| JP | 2005-192191 | | 7/2005 |
| JP | 2005-295336 | | 10/2005 |
| JP | 2006267967 | | 10/2006 |
| JP | 2006-352472 | | 12/2006 |
| KR | 1020060107525 | A | 10/2006 |
| KR | 1020070107906 | A | 11/2007 |

OTHER PUBLICATIONS

European Office Action dated Jan. 26, 2010 corresponding to the Korean priority application No. 10-2008-0002611.

Korean Office Action issued by Korean Patent Office on Apr. 12, 2010 corresponding Korean Patent Application No. 10-2008-0002611 and Request for Entry of the Accompanying Office Action attached herewith.

Japanese Office Action dated Aug. 31, 2010 for the Japanese Patent Application No. 2008-72404 and a Request for Entry of the Accompanying Office Action herewith.

Certificate of Invention Patent issued by the Chinese Patent Office, dated May 18, 2011, corresponding to Chinese Patent Application No. 200910000349.4, together with English translation.

* cited by examiner

*Primary Examiner* — Kevin Pyo

(74) *Attorney, Agent, or Firm* — Robert E. Bushnell, Esq.

(57) ABSTRACT

A photo sensor capable of improved output used in a flat panel display (FPD). The photo sensor includes a first transistor coupled to a first power source, a first node, and a second node. A photo diode is also provided, as well as a second transistor, a third transistor, a fourth transistor, a fifth transistor, and a first capacitor.

16 Claims, 5 Drawing Sheets

PHOTO SENSOR AND FLAT PANEL DISPLAY USING THE SAME

CLAIM OF PRIORITY

This application makes reference to, incorporates the same herein, and claims all benefits accruing under 35 U.S.C. §119 from an application for PHOTO SENSOR AND PLAT PANEL DISPLAY USING THE SAME earlier filed in the Korean Intellectual Property Office on 9 Jan. 2008 and there duly assigned Serial No. 10-2008-0002611.

BACKGROUND OF THE INVENTION

1. Field of the Invention

The present invention relates to a photo sensor and a flat panel display (FPD) using the same, and more particularly, to a photo sensor capable of controlling brightness to correspond to peripheral light and a FPD using the same.

2. Description of the Related Art

Recently, various flat panel displays (FPD) capable of reducing weight and volume that are not favorable features in cathode ray tubes (CRT) have been developed. The FPDs include liquid crystal displays (LCD), field emission displays (FED), plasma display panels (PDP), and organic light emitting displays.

Among the FPDs, the organic light emitting displays display images using organic light emitting diodes (OLED) that generate light by re-combination of electrons and holes.

The organic light emitting displays are widely used in personal digital assistants (PDA), MP3s, and DSCs as well as in mobile telephones have various advantages such as high color producibility and small thickness.

In the FPD, the visibility of a displayed image varies in accordance with the brightness of peripheral light. That is, although an image is displayed with the same brightness, a displayed image seems to be darker when the brightness of peripheral light is high, and a displayed image seems to be brighter when the brightness of peripheral light is low.

That is, in order to improve the visibility, the brightness of the peripheral light is sensed to increase the brightness of the displayed image when the brightness of the peripheral light is high, and to reduce the brightness of the displayed image when the brightness of the peripheral light is low. In addition, when the brightness of the image is controlled by the brightness of the peripheral light, it is not necessary to increase the brightness of the image so that power consumption can be reduced.

Therefore, a method of attaching a photo sensor for sensing the peripheral light to the FPD to control the brightness of the displayed image to correspond to the peripheral light is conceived.

However, when the photo sensor is realized in the form of an additional chip to be positioned in the outside, an additional power source is required to be transmitted to the photo sensor so that the power consumption of the photo sensor is large. On the other hand, if the photo sensor is provided in the inside, the output of the photo sensor is small so that it cannot favorably operate.

The above information disclosed in this Description of the Related Art section is only for enhancement of understanding of the background of the invention and therefore it may contain information that does not form the prior art that is already known to a person of ordinary skill in the art.

SUMMARY OF THE INVENTION

Accordingly, it is an object of the present invention to provide a photo sensor that is built-in on a panel and whose output is improved to be stably operated and a flat panel display (FPD) using the same.

In order to achieve the foregoing and/or other objects of the present invention, according to a first aspect of the present invention, a photo sensor comprises a first transistor whose first electrode is coupled to a first source of power, whose second electrode is coupled to a first node, and whose gate electrode is coupled to a second node, a photo diode whose first electrode is coupled to the first source of power and whose second electrode is coupled to the second node, a second transistor whose first electrode is coupled to a cathode electrode of the photo diode, whose second electrode is coupled to the second node, and whose gate electrode is coupled to a first control line, a third transistor whose first electrode is coupled to the second node, whose second electrode is coupled to the first node, and whose gate electrode is coupled to a reset signal line, a fourth transistor whose first electrode is coupled to the first node, whose second electrode is coupled to a first output end, and whose gate electrode is coupled to the reset signal line, a fifth transistor whose first electrode is coupled to the first node, whose second electrode is coupled to a second output end, and whose gate electrode is coupled to a second control line, and a first capacitor whose first electrode is coupled to the first source of power and whose second electrode is coupled to the second node.

According to a second aspect of the present invention, a flat panel display (FPD) comprises a pixel unit for displaying an image corresponding to data signals and scan signals, a data driver for receiving video signals and for generating the data signals to transmit the data signals to the pixel unit, a scan driver for generating the scan signals to transmit the scan signals to the pixel unit, and a photo sensor for sensing brightness of peripheral light to control brightness of the image to correspond to the brightness of the peripheral light. The photo sensor comprises a first transistor whose first electrode is coupled to a first source of power, whose second electrode is coupled to a first node, and whose gate electrode is coupled to a second node, a photo diode whose first electrode is coupled to the first source of power and whose second electrode is coupled to the second node, a second transistor whose first electrode is coupled to a cathode electrode of the photo diode, whose second electrode is coupled to the second node, and whose gate electrode is coupled to a first control line, a third transistor whose first electrode is coupled to the second node, whose second electrode is coupled to the first node, and whose gate electrode is coupled to a reset signal line, a fourth transistor whose first electrode is coupled to the first node, whose second electrode is coupled to a first output end, and whose gate electrode is coupled to the reset signal line, a fifth transistor whose first electrode is coupled to the first node, whose second electrode is coupled to a second output end, and whose gate electrode is coupled to a second control line, and a first capacitor whose first electrode is coupled to the first source of power and whose second electrode is coupled to the second node.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1:
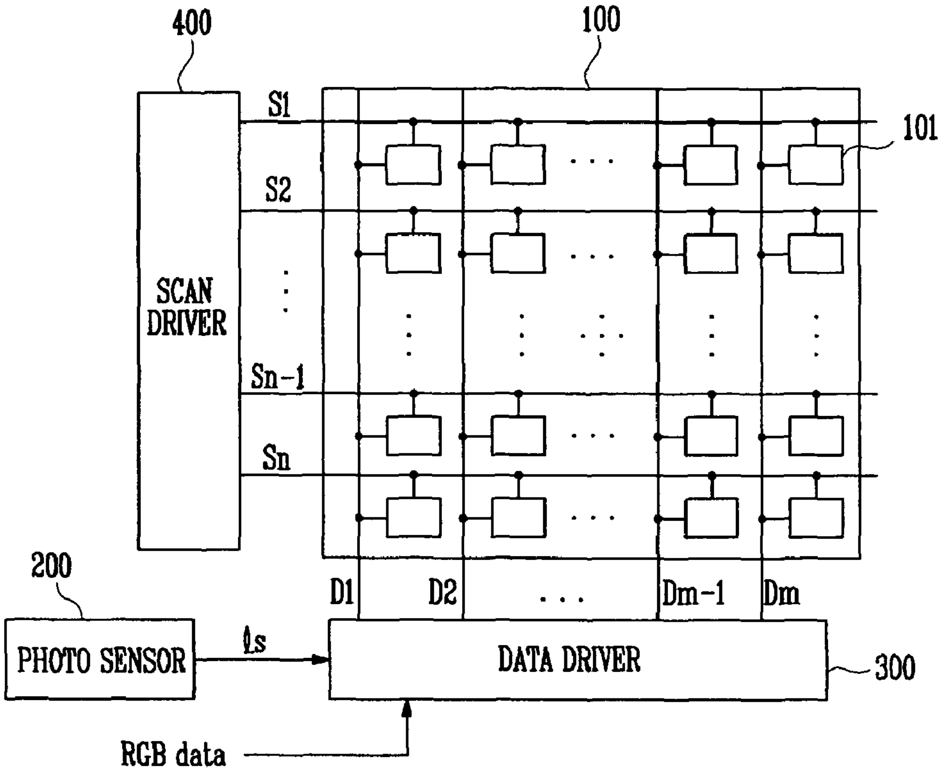
FIG. 1 illustrates the structure of an organic light emitting display that is an example of a flat panel display (FPD) according to the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Hereinafter, exemplary embodiments of the present invention will be described with reference to the attached drawings.

FIG. 1 illustrates the structure of an organic light emitting display that is an example of a flat panel display (FPD) according to the present invention. Referring to FIG. 1, the organic light emitting display includes a pixel unit 100, a photo sensor 200, a data driver 300, and a scan driver 400.

The pixel unit 100 includes a plurality of pixels 101, and each of the pixels 101 includes an organic light emitting diode (not shown) that emits light to correspond to the flow of current. The pixel unit 100 includes n scan lines S1, S2, . . . , Sn-1, and Sn arranged in a row direction to transmit scan signals and m data lines D1, D2, . . . , Dm-1, and Dm arranged in a column direction to transmit data signals.

The pixel unit 100 receives a first source of power ELVDD and a second source of power ELVSS from the outside so that it may be driven. Therefore, the pixel unit 100 displays an image using the OLEDs that emit light by the scan signals, the data signals, the first source of power ELVDD, and the second source of power ELVSS.

The photo sensor 200 generates photo sensing signals 1*s* for sensing peripheral light to control the brightness of an image displayed by the pixel unit 100 to correspond to the brightness of the peripheral light. The photo sensing signals 1*s* are transmitted to the data driver 300 so that the data driver 300 generates data signals corresponding to the photo sensing signals 1*s*.

The data driver 300 for generating the data signals receives video signals R, G, and B data having red, blue, and green components and the photo sensing signals is to generate the data signals. Then, the data driver 300 is coupled to the data lines D1, D2, . . . , Dm-1, and Dm of the pixel unit 100 to apply the generated data signals to the pixel unit 100.

The scan driver 400 for generating scan signals is coupled to the scan lines S1, S2,. Sn-1, and Sn to transmit the scan signals to a pixel unit 100 in a specific row. The data signals output from the data driver 300 are transmitted to the pixel 101 to which the scan signals are transmitted to generate driving current. The driving current flows to the OLEDs so that the OLEDs emit light.

Figure 2:
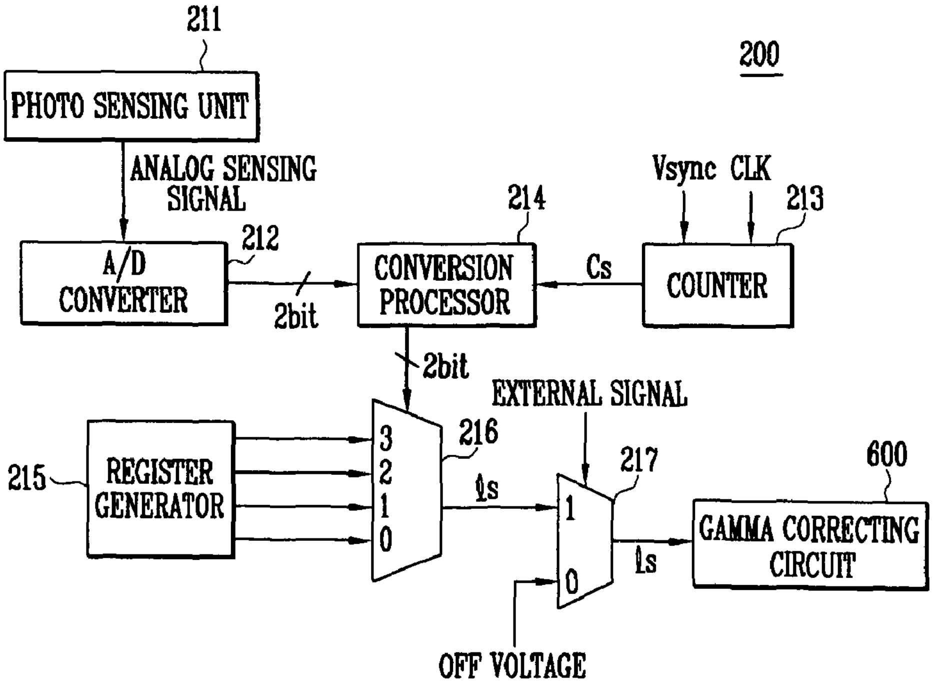
FIG. 2 illustrates an example of a photo sensor adopted by the organic light emitting display of FIG. 1.

FIG. 2 illustrates an example of a photo sensor adopted by the organic light emitting display of FIG. 1. Referring to FIG. 2, the photo sensor 200 includes a photo sensing unit 211, an A/D converter 212, a counter 213, a conversion processor 214, a register generator 215, a first selector 216, and a second selector 217. The photo sensor 200 is coupled to the gamma correcting circuit 600.

The photo sensing unit 211 measures the brightness of peripheral light and divides the brightness of the peripheral light into a plurality of steps to output analog sensing signals corresponding to the brightness of the steps. Here, the analog sensing signals are output to correspond to the brightness of the steps in accordance with the amount of current.

The A/D converter 212 compares the analog sensing signals output from the photo sensing unit 211 with set reference current and outputs digital sensing signals corresponding to the analog sensing signals. For example, the A/D converter 212 outputs a digital sensing signal of '11' in a step where peripheral brightness is highest and outputs a digital sensing signal of '10' in a step where peripheral brightness is relatively high. In addition, the A/D converter 212 outputs a digital sensing signal of '01' in a step where the peripheral brightness is relatively low and outputs a digital sensing signal of '00' in a step where the peripheral brightness is lowermost.

The counter 213 counts predetermined numbers during a predetermined time by a vertical synchronizing signal Vsync supplied from the outside to output counting signals Cs corresponding to the counted numbers. For example, in the case of the counter 213 referring to a binary value of 2 bits, the counter 213 is initialized to '00' when the vertical synchronizing signal Vsync is input and then, sequentially shifts clock CLK signals to count numbers to '11'. Then, when the vertical synchronizing signal Vsync is input to the counter 213, the counter 213 is reset to an initial state. By performing such operations, the counter 213 sequentially counts the numbers from '00' to '11' in a single frame period. The counter 213 outputs the counting signals Cs corresponding to the counted numbers to the conversion processor 214.

The conversion processor 214 outputs control signals to select the set values of the registers using the counting signals Cs output from the counter 213 and the sensing signals output from the A/D converter 212. That is, the conversion processor 214 outputs the control signals corresponding to digital signals selected when the counter 213 outputs predetermined signals and maintains the output control signals in a period of one frame. The conversion processor 214 resets the output control signals in a next frame and outputs the control signals corresponding to the sensing signals output from the A/D converter 212 to maintain the control signals in the period of one frame. For example, when the peripheral light is brightest, the conversion processor 214 outputs a control signal corresponding to the sensing signal of '11' and maintains the control signal in the period of one frame counted by the counter 213. In addition, when the peripheral light is darkest, the conversion processor 214 outputs a control signal corresponding to the sensing signal of '00' and maintains the control signal in the period of one frame counted by the counter 213. Then, the conversion processor 214 outputs control signals corresponding to the sensing signals of '10' and '01' when the peripheral light is relatively bright or dark in the above-mentioned operation.

The register generator 215 divides the brightness of the peripheral light into a plurality of steps to store a plurality of register set values corresponding to the steps.

The first selector 216 selects register set values corresponding to the control signals set by the conversion processor 214 among the plurality of register set values stored in the register generator 215 to output the photo sensing signals Is corresponding to the register set values.

The second selector 217 receives a set value of one bit for controlling on and off from the outside. The second selector 217 outputs the photo sensing signals Is received from the first selector 216 when the set value is selected as '1' and senses that the photo sensing unit 200 is turned off when the set value is selected as '0'.

The gamma correcting circuit 600 generates a plurality of gamma correcting signals corresponding to the photo sensing signals Is generated to correspond to the register set values. At this time, since the photo sensing signals Is correspond to the sensing signals output from the photo sensing unit 211, the gamma correcting signals have different values in accordance with the brightness of the peripheral light. The above operations are carried out by R, G, and B. Here, it is illustrated that the gamma correcting circuit 600 is included in the photo sensor 200. However, the gamma correcting circuit 600 can be separated from the photo sensor 200.

Figure 3:
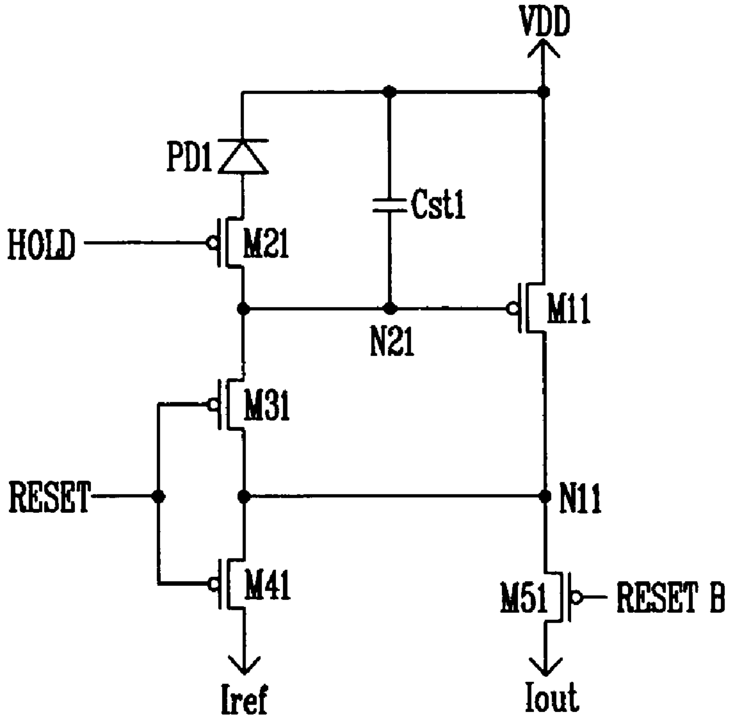
FIG. 3 is a circuit diagram illustrating the photo sensor of FIG. 2 according to a first embodiment.

FIG. 3 is a circuit diagram illustrating the photo sensor of FIG. 2 according to a first embodiment. Referring to FIG. 3, the photo sensing unit 211 includes a photo diode PD1, a first transistor M11, a second transistor M21, a third transistor M31, a fourth transistor M41, a fifth transistor M51, and a capacitor Cst1.

The cathode electrode of the photo diode PD1 is coupled to a first power source VDD, and the anode electrode of the photo diode PD1 is coupled to the source electrode of the second transistor M21. When light is incident on the photo diode PD1, current flows from the cathode electrode to the anode electrode, and the amount of the current that flows is controlled in accordance with the brightness of incident light. Therefore, the intensity of the peripheral light can be sensed using the current that flows from the cathode electrode of the photo diode PD1 to the anode electrode of the photo diode PD1.

The source electrode of the first transistor M11 is coupled to the first power source VDD, the drain electrode of the first transistor M11 is coupled to a first node N11, and the gate electrode of the first transistor M11 is coupled to a second node N21.

The source electrode of the second transistor M21 is coupled to the anode electrode of the photo diode PD1, the drain electrode of the second transistor M21 is coupled to the second node N21, and the gate electrode of the second transistor M21 is coupled to a first control line HOLD.

The source electrode of the third transistor M31 is coupled to the second node N21, the drain electrode of the third transistor M31 is coupled to the source electrode of the fourth transistor M41, and the gate electrode of the third transistor M31 is coupled to a reset signal line RESET. In order to reduce current leakage, the third transistor M31 can have a dual gate structure.

The source electrode of the fourth transistor M41 is coupled to the drain electrode of the third transistor M31, the drain electrode of the fourth transistor M42 is coupled to a first output terminal Iref, and the gate electrode of the fourth transistor M41 is coupled to the reset signal line RESET. The fourth transistor M41 can have the dual gate structure in order to reduce current leakage.

The source electrode of the fifth transistor M51 is coupled to the drain electrode of the first transistor M11, the drain electrode of the fifth transistor M51 is coupled to a second output terminal Iout, and the gate of the fifth transistor M51 is coupled to a reset bar signal line RESETB.

The first electrode of the capacitor Cst1 is coupled to the first power source VDD, and the second electrode of the capacitor Cst1 is coupled to the second node N21.

Figure 4:
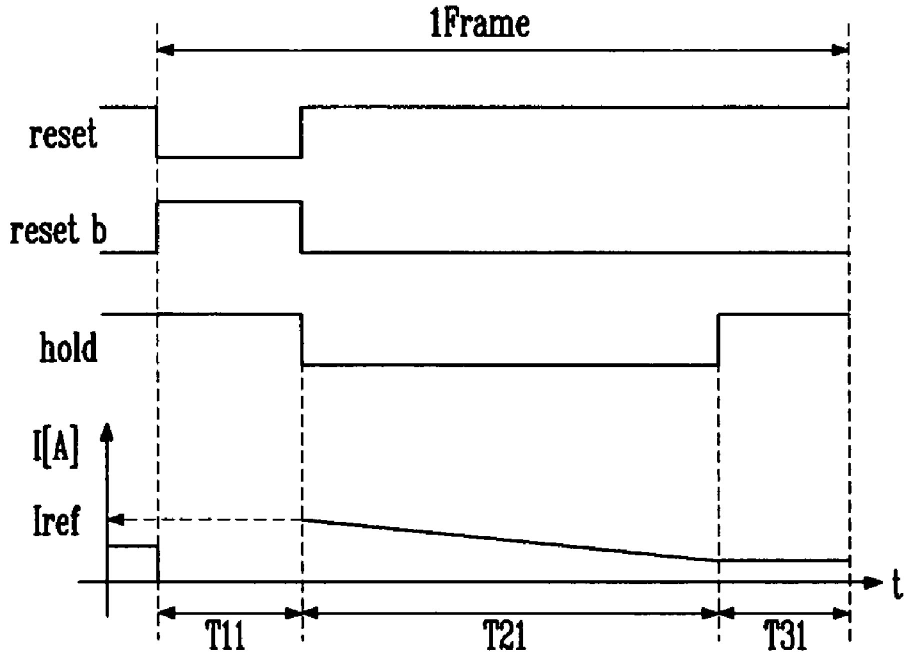
FIG. 4 illustrates waveforms illustrating the operation of the photo sensor of FIG. 3.

FIG. 4 illustrates waveforms illustrating the operation of the photo sensor of FIG. 3. Referring to FIG. 4, the photo sensing unit operates in a reset period T11, an integrating period T21, and a sampling period T31. Here, in the reset period T11, a reset signal reset transmitted through the reset signal line RESET is maintained to be in a low level, and a reset bar signal resetb transmitted through the reset bar signal line RESETB and a first control signal hold transmitted through a first control line HOLD are maintained to be in high levels. In the integrating period T21, the reset signal reset is maintained to be in a high level, and the reset bar signal resetb and the first control signal hold are maintained to be in a low level. In addition, in the sampling period T31, the reset signal reset and the first control signal hold are maintained to be in a high level, and the reset bar signal resetb is maintained to be in a low level.

In the reset period T11, since the reset signal reset is in a low level, and the reset bar signal resetb and the first control signal hold are in a high level, the third transistor M31 and the fourth transistor M41 are turned on. At this time, when reference current iref flows through the first output terminal Iref coupled to the drain electrode of the fourth transistor M41, the second node N21 has a predetermined voltage corresponding to the amount of current of the reference current iref. The predetermined voltage is maintained by the capacitor Cst1. In addition, since the second transistor M21 is turned off, although light is incident on the photo diode PD1, the current does not flow from the cathode electrode to the anode electrode.

In the integrating period T21, the first control signal hold and the reset bar signal resetb are in a low level, and the reset signal reset is in a high level so that the second transistor M21 and the fifth transistor M51 are turned on. Therefore, the current flows from the cathode electrode of the photo diode PD1 to the anode electrode of the photo diode PD1 by the light incident on the photo diode PD1. Therefore, the voltage of the second node N21 coupled to the cathode electrode of the photo diode PD1 changes.

In the sampling period T31, since the reset signal reset and the first control signal hold are in a high level and the reset bar signal resetb is in a low level, the fifth transistor M51 is turned on. Therefore, the photo diode PD1 is not coupled to the second node N21. As a result, the voltage of the second node N21 does not change and is maintained by the capacitor Cst1. Then, a second output end lout is coupled to the drain electrode of the first transistor M11 by the fifth transistor M51. Therefore, the current that flows from the source electrode of the first transistor M11 to the drain electrode of the first transistor M11 flows to the outside through the second output end lout to correspond to the voltage of the second node N21. At this time, the current that flows through the second output end lout is used as a sensing signal.

The sensing signal is not output from the photo diode PD1 but formed of current that directly flows from the first power source VDD, and thus the current stably flows. In addition, since the amount of current of the sensing signal can be controlled using the magnitude of the reference current iref, the amount of current of the sensing signal can be made large enough. Therefore, the dynamic range of the photo diode PD1 increases.

Figure 5:
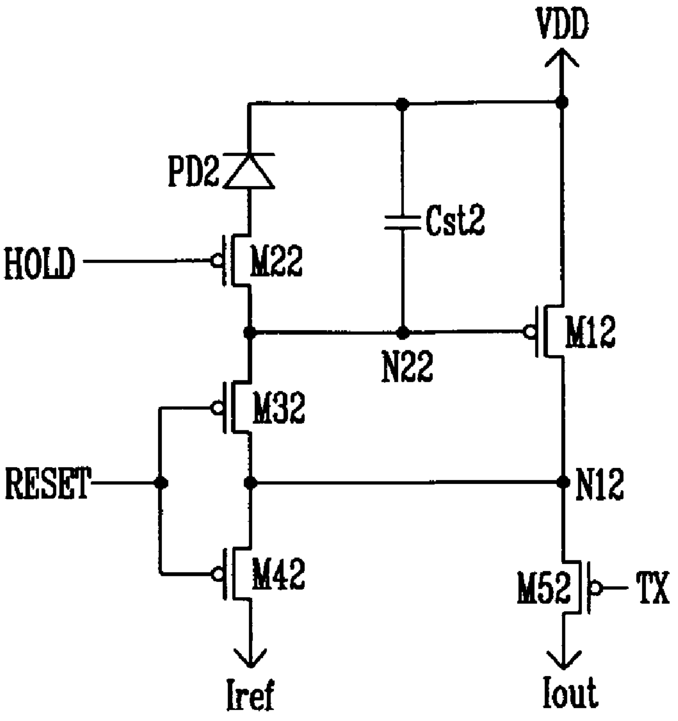
FIG. 5 is a circuit diagram illustrating the photo sensor of FIG. 2 according to a second embodiment.

FIG. 5 is a circuit diagram illustrating the photo sensor of FIG. 2 according to a second embodiment. Referring to FIG. 5, the photo sensing unit includes a photo diode PD2, a first transistor M12, a second transistor M22, a third transistor M32, a fourth transistor M42, a fifth transistor M52, and a capacitor Cst2.

The cathode electrode of the photo diode PD2 is coupled to the first power source VDD, and the anode electrode of the photo diode PD2 is coupled to the source electrode of the second transistor M22. When light is incident on the photo diode PD2, current flows from the cathode electrode of the photo diode PD2 to the anode electrode of the photo diode PD2. The amount of the current that flows is controlled by the brightness of the incident light. Therefore, the intensity of peripheral light can be sensed using the current that flows from the cathode electrode of the photo diode PD2 to the anode electrode of the photo diode PD2.

The source electrode of the first transistor M12 is coupled to the first power source VDD, the drain electrode of the first transistor M12 is coupled to the first node N12, and the gate electrode of the first transistor M12 is coupled to a second node N22.

The source electrode of the second transistor M22 is coupled to the anode electrode of the photo diode PD2, the drain electrode of the second transistor M22 is coupled to the second node N22, and the gate electrode of the second transistor M22 is coupled to the first control line HOLD.

The source electrode of the third transistor M32 is coupled to the second node N22, the drain electrode of the third transistor M32 is coupled to the source electrode of the fourth transistor M42, and the gate electrode of the third transistor M32 is coupled to the reset signal line RESET. The third transistor M32 can have the dual gate structure in order to reduce current leakage.

The source electrode of the fourth transistor M42 is coupled to the drain electrode of the third transistor M32, the drain electrode of the fourth transistor M42 is coupled to the first output terminal Iref, and the gate electrode of the fourth transistor M42 is coupled to the reset signal line RESET. The fourth transistor M42 can have the dual gate structure in order to reduce current leakage.

The source electrode of the fifth transistor M52 is coupled to the drain electrode of the first transistor M12, the drain electrode of the fifth transistor M52 is coupled to the second output terminal Iout, and the gate electrode of the fifth transistor M52 is coupled to a second control signal TX.

The first electrode of the capacitor Cst2 is coupled to the first power source VDD, and the second electrode of the capacitor Cst2 is coupled to the second node N22.

Figure 6:
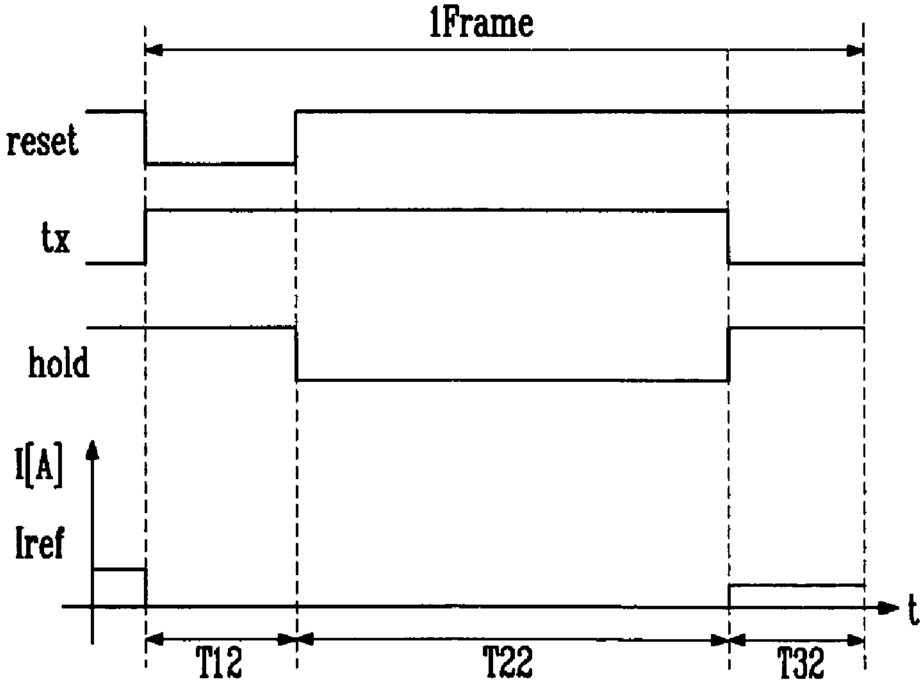
FIG. 6 illustrates waveforms illustrating the operation of the photo sensor of FIG. 5.

FIG. 6 illustrates waveforms illustrating the operation of the photo sensor of FIG. 5. Referring to FIG. 6, the photo sensing unit operates in a reset period T12, an integrating period T22, and a sampling period T32. Here, in the reset period T12, a reset signal reset transmitted through the reset signal line RESET is maintained to be in a low level, and a second control signal tx transmitted through a second control line TX and the first control signal hold transmitted through the first control line HOLD are maintained to be in a high level. In the integrating period T22, the reset signal reset and the second control signal tx are maintained to be in a high level, and the first control signal hold is maintained to be in a low level. In addition, in the sampling period T32, the reset signal reset and the first control signal hold are maintained to be in a high level, and the second control signal tx is maintained to be in a low level.

In the reset period T12, since the reset signal reset is in a low level and the first control signal hold and the second control signal tx are in a high level, the third transistor M32 and the fourth transistor M42 are turned on. At this time, the reference current iref flows through the first output terminal Iref coupled to the drain electrode of the fourth transistor M42. Therefore, the second node N22 has a predetermined voltage corresponding to the amount of current of the reference current iref, and the voltage is maintained by the capacitor Cst2. In addition, since the second transistor M22 is turned off, although light is incident on the photo diode PD2, the current does not flow from the cathode electrode of the photo diode PD2 to the anode electrode of the photo diode PD2.

In the integrating period T22, the first control signal hold is in a low level, and the second control signal tx and the reset signal reset are in a high level, so that so that the second transistor M22 is turned on. Therefore, the current flows from the cathode electrode of the photo diode PD2 to the anode electrode of the photo diode PD2 by the light incident on the photo diode PD2. Therefore, the voltage of the second node N22 coupled to the cathode electrode of the photo diode PD2 changes. At this time, since the fifth transistor M52 is maintained to be turned off by the second control signal tx, it is possible to prevent the current from flowing through the second output end Iout.

In the sampling period T32, since the reset signal reset and the first control signal hold are in a high level and the second control signal tx is in a low level, the fifth transistor M52 is turned on. Therefore, the photo diode PD2 is not coupled to the second node N22 so that the voltage of the second node N22 does not change but is maintained by the capacitor Cst2. Then, the second output end lout is coupled to the drain electrode of the first transistor M52 by the fifth transistor M52. Therefore, the current that flows from the source electrode of the first transistor M12 to the drain electrode of the first transistor M12 flows to the outside through the second output end lout to correspond to the voltage of the second node N22. At this time, the current that flows through the second output end lout is used as the sensing signal.

Figure 7:
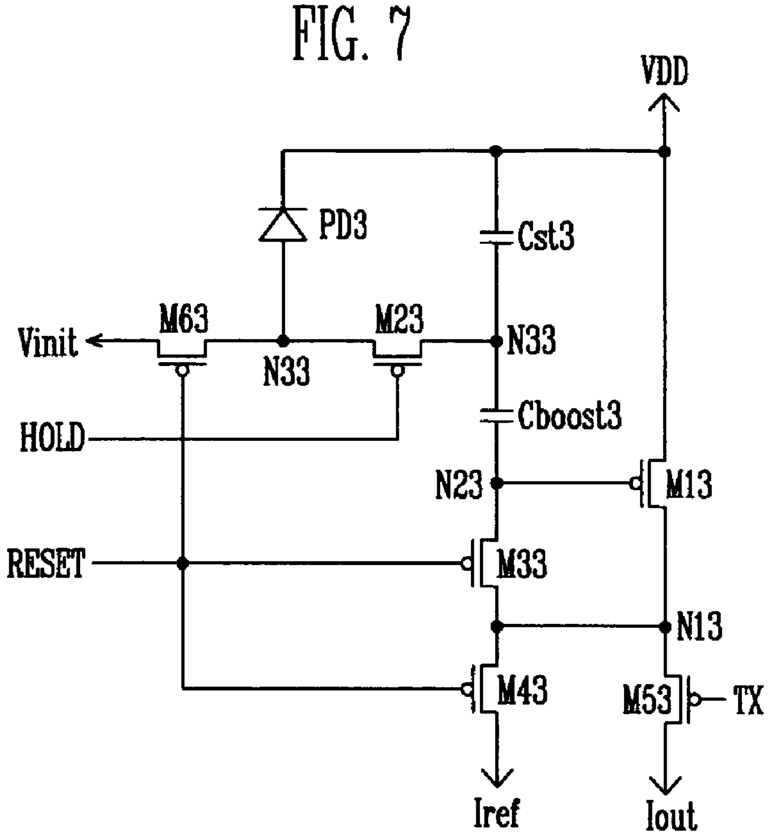
FIG. 7 is a circuit diagram illustrating the photo sensor of FIG. 2 according to a third embodiment.

FIG. 7 is a circuit diagram illustrating the photo sensor of FIG. 2 according to a third embodiment. Referring to FIG. 7, the photo sensing unit includes a photo diode PD3, a first transistor M13, a second transistor M23, a third transistor M33, a fourth transistor M43, a fifth transistor M53, a sixth transistor M63, a first capacitor Cst3, and a second capacitor Cboost3.

The cathode electrode of the photo diode PD3 is coupled to the first power source VDD, and the anode electrode of the photo diode PD3 is coupled to the source electrode of the second transistor M23. When light is incident on the photo diode PD3, current flows from the cathode electrode to the anode electrode and the amount of the current is controlled by the brightness of the incident light. Therefore, the intensity of peripheral light can be sensed using the current that flows from the cathode electrode of the photo diode PD3 to the anode electrode of the photo diode PD3.

The source electrode of the first transistor M13 is coupled to the first power source VDD, the drain electrode of the first transistor M13 is coupled to a first node N13, and the gate electrode of the first transistor M13 is coupled to a second node N23.

The source electrode of the second transistor M23 is coupled to the anode electrode of the photo diode PD3, the drain electrode of the second transistor M23 is coupled to a third node N33, and the gate electrode of the second transistor M23 is coupled to a first control line HOLD.

The source electrode of the third transistor M33 is coupled to the second node N23, the drain electrode of the third transistor M33 is coupled to the source electrode of the fourth transistor M43, and the gate electrode of the third transistor M33 is coupled to a reset signal line RESET. In order to reduce current leakage, the third transistor M33 can have the dual gate structure.

The source electrode of the fourth transistor M43 is coupled to the drain electrode of the third transistor M33, the drain electrode of the fourth transistor M43 is coupled to the first output terminal Iref, and the gate electrode of the fourth transistor M43 is coupled to the reset signal line RESET. The fourth transistor M43 can have a dual gate structure in order to reduce the leakage current.

The source electrode of the fifth transistor M53 is coupled to the drain electrode of the first transistor M13, the drain electrode of the fifth transistor M53 is coupled to a second output terminal lout, and the gate of the fifth transistor M53 is coupled to the second control signal line TX.

The source electrode of the sixth transistor M63 is coupled to an initialization signal line Vinit, the drain electrode of the sixth transistor M63 is coupled to the anode electrode of the photo diode PD3, and the gate electrode of the sixth transistor M63 is coupled to the reset signal line RESEST.

The first electrode of the first capacitor Cst3 is coupled to the first power source VDD, and the second electrode of the first capacitor Cst3 is coupled to the third node N33.

The first electrode of the second capacitor Cboost3 is coupled to the third node N33, and the second electrode of the second capacitor Cboost3 is coupled to the second node N23.

Figure 8:
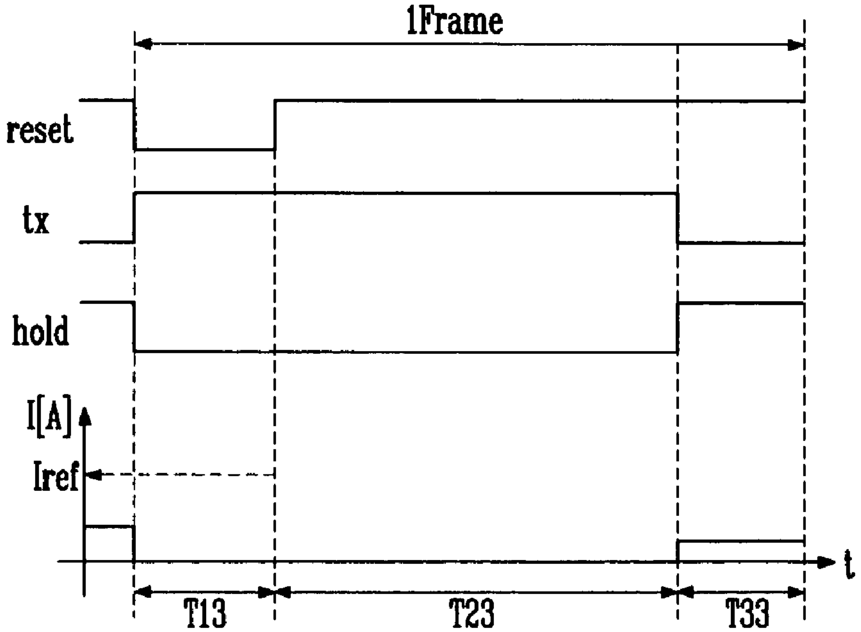
FIG. 8 illustrates waveforms illustrating the operation of the photo sensor of FIG. 7.

FIG. 8 illustrates waveforms illustrating the operation of the photo sensor of FIG. 7. Referring to FIG. 8, the photo sensing unit operates in a reset period T13, an integrating period T23, and a sampling period T33. Here, in the reset period T13, the reset signal reset transmitted through the reset signal line RESET and the first control signal hold transmitted through the first control line HOLD are maintained in a low level, and the second control signal tx transmitted through the second control line TX is maintained in a high level. In the integrating period T23, the reset signal reset and the second control signal tx are maintained in a high level, and the first control signal is maintained in a low level. In the sampling period T33, the reset signal reset and the first control signal hold are maintained in a high level, and the second control signal tx is maintained in a low level.

In the reset period T13, since the reset signal reset and the first control signal hold are in low levels and the second control signal tx is in a high level, the second transistor M23, the third transistor M33, the fourth transistor M43, and the sixth transistor M63 are turned on. Therefore, an initialization voltage is transmitted to the third node N33 so that the first capacitor Cst3 and the second capacitor Cboost3 are initialized by the initialization voltage. When the reference current iref flows through the first output terminal Iref coupled to the drain electrode of the fourth transistor M43, the second node N23 has a predetermined voltage Vref corresponding to the amount of current of the reference current iref. The predetermined voltage Vref is maintained by the first capacitor Cst3 and the second capacitor Cboost3. At this time, the predetermined voltage Vref is a voltage applied to the gate electrode of the first transistor M13 so that the reference current iref flows. Therefore, the current that flows from the source electrode of the first transistor M13 to the drain electrode of the first transistor M13 can be determined without considering the threshold voltage of the first transistor M13.

In the integrating period T23, since the first control signal hold is in a low level and the second control signal tx and the reset signal reset are in a high level, the second transistor M23 is maintained to be turned on. Therefore, current flows from the cathode electrode of the photo diode PD3 to the anode electrode of the photo diode PD3 by light incident on the photo diode PD3. Therefore, the current flows to the third node N33 coupled to the cathode electrode of the photo diode PD3 so that the voltage of the third node N33 changes by the initialization voltage+ΔV. The voltage of the second node N23 also changes by ΔV. Therefore, a voltage of Vref+ΔV is applied to the second node N23. Since the fifth transistor M53 is turned off, it is possible to prevent the current from flowing through the second output end Iout.

In the sampling period T33, the reset signal reset and the first control signal hold are in a high level, and the second control signal tx is in a low level, and accordingly the fifth transistor M53 is turned on. Therefore, the photo diode PD3 is not coupled to the third node N33, and the voltage of the second node N23 does not change by the first capacitor Cst3 and the second capacitor Cboost3. Then, since the second output end lout is coupled to the drain electrode of the first transistor M13 by the fifth transistor M53, the current that flows from the source electrode of the first transistor M13 to the drain electrode of the first transistor M13 flows to the outside through the second output end lout to correspond to the second node N23. At this time, the current that flows to the outside through the second output end lout is used as the sensing signal.

Figure 9:
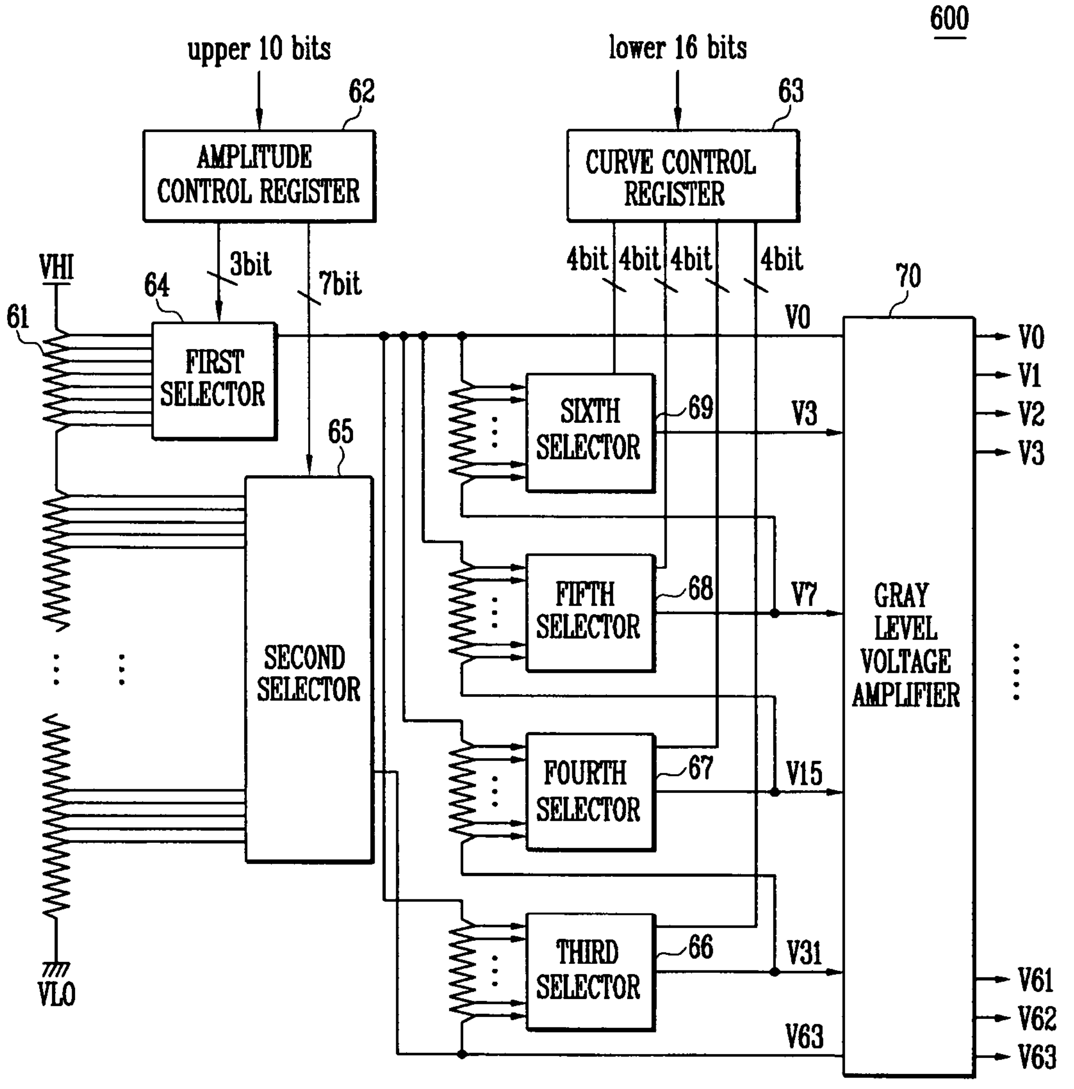
FIG. 9 illustrates the structure of the gamma correcting circuit of FIG. 2.

FIG. 9 illustrates the structure of the gamma correcting circuit of FIG. 2. Referring to FIG. 9, the gamma correcting circuit 600 includes a ladder resistor 61, an amplitude control register 62, a curve control register 63, first to sixth selectors 64 to 69, and a gray level voltage amplifier 70.

In the ladder resistor 61, the uppermost level voltage VHI supplied from the outside is determined as a reference voltage, and a plurality of variable resistors included between the lowermost level voltage VLO and a reference voltage are serially coupled to each other. A plurality of gray level voltages are generated through the ladder resistor 61. Here, when the value of the ladder resistor 61 is small, an amplitude correction range is narrow, whereas a correction preciseness degree increases. On the other hand, when the value of the ladder resistor 61 is large, the amplitude correction range is wide, whereas the correction preciseness degree is reduced.

The amplitude control register 62 outputs a register set value of 3 bits to a first selector 64 and outputs a register set value of 7 bits to a second selector 65. At this time, the number of set bits can be increased to increase the number of selectable gray levels, and the register set value is changed to vary a gray level voltage.

The curve control register 63 outputs register set values of 4 bits to the third to sixth selectors 66 to 69. At this time, the register set value can vary and a selectable gray level voltage can be controlled in accordance with the register set value.

Upper 10 bits among the register values generated by the register generator 215 of FIG. 2 are input to the amplitude control register 62, and lower 16 bits are input to the curve control register 63 to be selected as the register set value.

The first selector 64 selects a gray level voltage corresponding to a register set value of 3 bits set by the amplitude control register 62 among a plurality of gray level voltages divided through the ladder resistor 61 to output the selected gray level voltage as the uppermost gray level voltage.

The second selector 65 selects a gray level voltage corresponding to a register set value of 7 bits selected by the amplitude control register 62 among the plurality of gray level voltages divided through the ladder resistor 61 to output as the lowermost gray level voltage.

The third selector 66 divides a voltage between gray level voltages output from the first selector 64 and gray level voltages output from the second selector 65 into a plurality of gray level voltages through a plurality of resistor columns and selects a gray level voltage corresponding to a register set value of 4 bits to output the register set value.

The fourth selector 67 divides a voltage between gray level voltages output from the first selector 64 and gray level voltages output from the third selector 66 into a plurality of gray level voltages through a plurality of resistor columns and selects a gray level voltage corresponding to a register set value of 4 bits to output the register set value.

The fifth selector 68 selects a gray level voltage corresponding to the register set value of 4 bits among the gray level voltages between the first selector 64 and the fourth selector 67 to output the selected gray level voltage.

The sixth selector 69 selects a gray level voltage corresponding to the register set value of 4 bits among the gray level voltages between the first selector 64 and the fifth selector 68 to output the selected gray level voltage.

By performing the above operations, the curve of an intermediate gray level unit is controlled in accordance with the register set value of the curve control register 63 to easily correct a gamma characteristic in accordance with the characteristics of the OLEDs. Here, in order to make gamma curve convex downward, a potential difference between the gray levels is made larger as a smaller gray level is displayed. On the other hand, in order to make the gamma curve convex upward, the resistor value of the ladder resistor 61 is set so that the potential difference between the gray levels is smaller as a smaller gray level is displayed.

The gray level voltage amplifier 70 outputs a plurality of gray level voltages corresponding to the plurality of gray levels to be displayed on the pixel unit 100 of FIG. 1. In FIG. 9, the outputs of gray level voltages corresponding to 64 gray levels are illustrated.

The above operations can be performed so that R, G, and B obtain almost the same brightness characteristics in consideration of a change in the R, G, and B OLEDs. Therefore, gamma correcting circuits are provided in the R, G, and B groups so that the curve and the amplitude obtained through the curve control register 63 and the amplitude control register 62 vary by the R, G, and B.

In the photo sensor according to the present invention and the FPD using the same, the current output from the photo sensor is amplitude and the amount of current is improved to increase the dynamic range of the photo sensor.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A photo sensor, comprising:

a first transistor whose first electrode is coupled to a first power source, whose second electrode is coupled to a first node, and whose gate electrode is coupled to a second node;

a photo diode whose first electrode is coupled to the first power source and whose second electrode is coupled to the second node;

a second transistor whose first electrode is coupled to a cathode electrode of the photo diode, whose second electrode is coupled to the second node, and whose gate electrode is coupled to a first control line;

a third transistor whose first electrode is coupled to the second node, whose second electrode is coupled to the first node, and whose gate electrode is coupled to a reset signal line;

a fourth transistor whose first electrode is coupled to the first node, whose second electrode is coupled to a first output end, and whose gate electrode is coupled to the reset signal line;

a fifth transistor whose first electrode is coupled to the first node, whose second electrode is coupled to a second output end, and whose gate electrode is coupled to a second control line; and a first capacitor whose first electrode is coupled to the first power source and whose second electrode is coupled to the second node.

2. The photo sensor as claimed in claim 1, further comprising:

a sixth transistor whose first electrode is coupled to a third node, whose second electrode is coupled to an initialization signal line, and whose gate electrode is coupled to the reset signal line; and a second capacitor whose first electrode is coupled to the second electrode of the first capacitor and the second electrode of the second transistor and whose second electrode is coupled to the second node.

3. The photo sensor as claimed in claim 1, wherein the reset signal line transmits a reset signal, and wherein the reset signal has a first period in which the third transistor and the fourth transistor are turned on and a second period and a third period in which the third transistor and the fourth transistor are turned off.

4. The photo sensor as claimed in claim 3, wherein the first control line transmits a first control signal, and wherein the first control signal enables the second transistor to be turned off in the first period and the third period and enables the second transistor to be turned on in the second period.

5. The photo sensor as claimed in claim 3, wherein the first control line transmits the first control signal, and wherein the first control signal enables the second transistor to be turned on in the first and second periods and enables the second transistor to be turned off in the third period.

6. The photo sensor as claimed in claim 1, wherein the second control line transmits a second control signal, and wherein the second control signal is a sub signal of the reset signal.

7. The photo sensor as claimed in claim 3, wherein the second control line transmits a second control signal, and wherein the second control signal enables the fifth transistor to be turned off in the first period and the second period and enables the fifth transistor to be turned on in the third period.

8. A flat panel display (FPD), comprising:

a pixel unit displaying an image corresponding to data signals and scan signals;

a data driver receiving video signals and generating the data signals to transmit the data signals to the pixel unit;

a scan driver generating the scan signals to transmit the scan signals to the pixel unit; and a photo sensor sensing brightness of peripheral light to control brightness of the image to correspond to the brightness of the peripheral light, the photo sensor comprising a first transistor whose first electrode is coupled to a first power source, whose second electrode is coupled to a first node, and whose gate electrode is coupled to a second node;

a photo diode whose first electrode is coupled to the first power source and whose second electrode is coupled to the second node;

a second transistor whose first electrode is coupled to a cathode electrode of the photo diode, whose second electrode is coupled to the second node, and whose gate electrode is coupled to a first control line;

a third transistor whose first electrode is coupled to the second node, whose second electrode is coupled to the first node, and whose gate electrode is coupled to a reset signal line;

a fourth transistor whose first electrode is coupled to the first node, whose second electrode is coupled to a first output end, and whose gate electrode is coupled to the reset signal line;

a fifth transistor whose first electrode is coupled to the first node, whose second electrode is coupled to a second output end, and whose gate electrode is coupled to a second control line; and a first capacitor whose first electrode is coupled to the first power source and whose second electrode is coupled to the second node.

9. The FPD as claimed in claim 8, a sixth transistor whose first electrode is coupled to a third node, whose second electrode is coupled to an initialization signal line, and whose gate electrode is coupled to the reset signal line; and a second capacitor whose first electrode is coupled to the second electrode of the first capacitor and the second electrode of the second transistor and whose second electrode is coupled to the second node.

10. The FPD as claimed in claim 8, wherein the reset signal line transmits a reset signal, and wherein the reset signal has a first period in which the third transistor and the fourth transistor are turned on and a second period and a third period in which the third transistor and the fourth transistor are turned off.

11. The FPD as claimed in claim 10, wherein the first control line transmits a first control signal, and wherein the first control signal enables the second transistor to be turned off in the first period and the third period and enables the second transistor to be turned on in the second period.

12. The FPD as claimed in claim 10, wherein the first control line transmits the first control signal, and wherein the first control signal enables the second transistor to be turned on in the first and second periods and enables the second transistor to be turned off in the third period.

13. The FPD as claimed in claim 8, wherein the second control line transmits a second control signal, and wherein the second control signal is a sub signal of the reset signal.

14. The FPD as claimed in claim 10, wherein the second control line transmits a second control signal, and wherein the second control signal enables the fifth transistor to be turned off in the first period and the second period and enables the fifth transistor to be turned on in the third period.

15. The FPD as claimed in claim 8, wherein the data driver further comprises a gamma correcting circuit to vary a gamma correcting value to correspond to the brightness of the peripheral light grasped by the photo sensor.

16. The FPD as claimed in claim 15, wherein the gamma correcting circuit comprises a plurality of gamma registers storing gamma correcting values to select one gamma register among the plurality of gamma registers to correspond to the brightness of the peripheral light.

* * * * *